United States Patent
Saxena et al.

(10) Patent No.: US 7,271,963 B2
(45) Date of Patent: Sep. 18, 2007

(54) BI-CURVATURE LENS FOR LIGHT EMITTING DIODES AND PHOTO DETECTORS

(75) Inventors: Kuldeep Kumar Saxena, Singapore (SG); Wee Sin Tan, Singapore (SG); Peng Yam Ng, Singapore (SG); Sin Heng Lim, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 178 days.

(21) Appl. No.: 11/074,883

(22) Filed: Mar. 7, 2005

(65) Prior Publication Data

US 2006/0198032 A1    Sep. 7, 2006

(51) Int. Cl.
G02B 3/10    (2006.01)
G02B 3/02    (2006.01)
F21V 5/00    (2006.01)
F21V 5/04    (2006.01)

(52) U.S. Cl. .................. 359/721; 359/708; 362/326; 362/332; 362/335

(58) Field of Classification Search ........... 359/721, 359/708–712, 718; 362/326, 332, 335, 336, 362/338
See application file for complete search history.

(56) References Cited

U.S. PATENT DOCUMENTS 4,740,259 A    4/1988    Heinen

2004/0126064 A1*    7/2004    Vandentop et al. ............ 385/49

FOREIGN PATENT DOCUMENTS

| EP | 0 813 079 A3 | 1/1998 |
|---|---|---|
| EP | 1251366 | 10/2002 |
| EP | 1 453 108 A1 | 9/2004 |
| JP | 2-106056 | 4/1990 |
| JP | 2001-281541 | 10/2001 |

OTHER PUBLICATIONS

UK Search Report dated Jul. 4, 2006 involving counterpart UK application No. GB0604476.2.

* cited by examiner

Primary Examiner—Ricky Mack
Assistant Examiner—Jack Dinh

(57) ABSTRACT

A bi-curvature lens for diodes in an infrared wireless communication transceiver is disclosed. Devices having such a bi-curvature lens, such as a light emitting device, a light detecting device, and a transceiver are also disclosed. A method for designing such a lens, and a method for fabricating a device having such a lens are also disclosed. The bi-curvature lens disclosed has a bottom hemispherical portion and a top aspherical portion. Light emitting diodes and photo detectors used in conjunction with bi-curvature lenses display symmetrical radiation intensity profiles, in accordance with Infrared Data Association standards and protocols.

4 Claims, 9 Drawing Sheets derson # BI-CURVATURE LENS FOR LIGHT EMITTING DIODES AND PHOTO DETECTORS

FIELD OF THE INVENTION

Embodiments of the present invention pertain generally to wireless communication devices. More specifically, embodiments of the present invention pertain to lenses used with light emitting diodes (LED) or LEDs chip/die and photo detectors (PD) or PDs chip/die in wireless communication devices.

BACKGROUND OF THE INVENTION

Light emitting diodes (LEDs) and photo detectors are widely used with or without lenses to facilitate wireless infrared communication in devices such as laptop computers, personal digital assistants, printers, mobile phones, modems, digital pagers, electronic cameras, and hand-held computers. The growing popularity of wireless communication has placed a tremendous demand for small form factor for components such as transceivers within wireless communication devices.

In a typical wireless communication device, an infrared transmitter (e.g. an LED chip/die with lens) is arranged adjacent to an infrared receiver (e.g. a photo detector chip/die) in an arrangement called a transceiver. An embedded LED chip/die with lens is called an emitter. An embedded PD die/chip with lens is called a transmitter. The transmitter and the receiver are connected with an integrated circuit for signal processing. On the surface of the transceiver, there are two lenses. A light emitting diode chip/die is located in or near the center of one of the lenses, and a photo detector chip/die is located in or near the center of the other lens. Conventionally, spherical lenses 110 described by a radius r (115), as depicted in FIG. 1, are employed to ensure proper directional distribution of light.

One method of evaluating LED lenses is the generation of a radiant intensity profile. The radiant intensity profile indicates flux of radiation per steradian of the surface of a lens. The term flux, in this context, refers to the energy per steradian of the emission of the LED. A steradian 210 is a three dimensional unit of spherical geometry, depicted in FIG. 2. One steradian 210 is a solid angle, e.g. a cone that, having its vertex 221 in the center of a sphere 201 of radius r (205), cuts off an area (220) on the surface of the sphere equal to that of a square with sides of length equal to the radius r of the sphere. In other words, one steradian 210 is a solid angle defining an area 220 equal to $r^2$ on the surface of a sphere 201 described by radius r (205).

A radiant intensity profile for a spherical lens is presented in FIG. 3. The curve of flux per steradian in a horizontal direction 310 is substantially symmetrical about the maximum 330. The curve of flux per steradian in a vertical direction 320 is also substantially symmetrical about the maximum 330. This symmetry in both the vertical and horizontal directions is required to satisfy the standards and protocols of the Infrared Data Association (IrDA), a non-profit organization dedicated to developing globally adopted specifications for infrared wireless communication. As can be appreciated, it is desirable for a commercially available device to conform to IrDA standards and protocols.

One approach to meeting the current demand for smaller components within wireless devices is to manufacture smaller spherical lenses for use with LEDs and photo detectors in infrared transceivers. However, as the diameter is decreased for spherical lenses used with LEDs, the brightness of the LEDs decreases, therefore signal output is compromised. As the diameter is decreased on spherical lenses used with photo detectors, less light is received at the photo detector, therefore signal processing is compromised.

SUMMARY OF THE INVENTION

Embodiments of the present invention, a light emitting device having a light emitting diode chip/die and a bi-curvature dome lens are disclosed. The bi-curvature dome lens according to embodiments of the present invention has a hemispherical bottom portion defined by a first radius and an aspherical upper portion defined by a second radius and a conic constant.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to various embodiments of the invention, examples of which are illustrated in the accompanying drawings. While the invention will be described in conjunction with various embodiments, it will be understood that they are not intended to limit the invention to these embodiments. On the contrary, the invention is intended to cover alternatives, modifications and equivalents, which may be included within the spirit and the scope of the invention as defined by the appended claims. Furthermore, in the following detailed description of the present invention, numerous specific details are set forth in order to provide a thorough understanding of the present invention. However, it will be apparent to one skilled in the art that the present invention may be practiced without these specific details. In other instances, well-known methods, procedures, components, structures and devices have not been described in detail so as to avoid unnecessarily obscuring aspects of the present invention.

Figure 1:
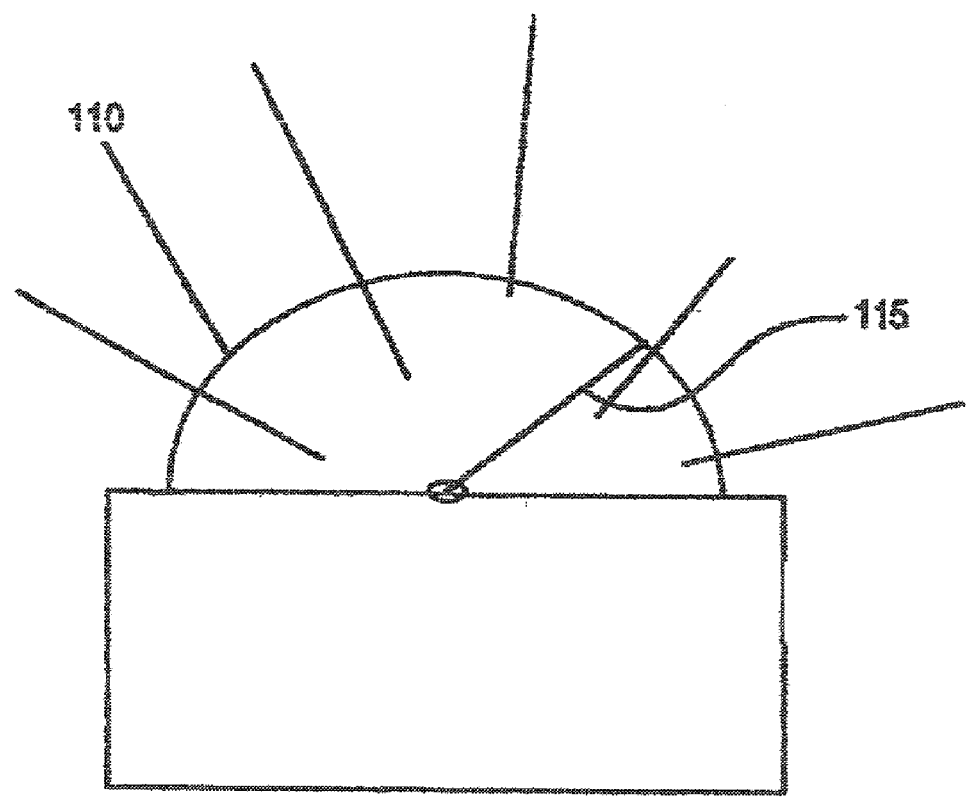
FIG. 1 is an illustration of a conventional spherical dome lens for an LED chip/die.
Figure 2:
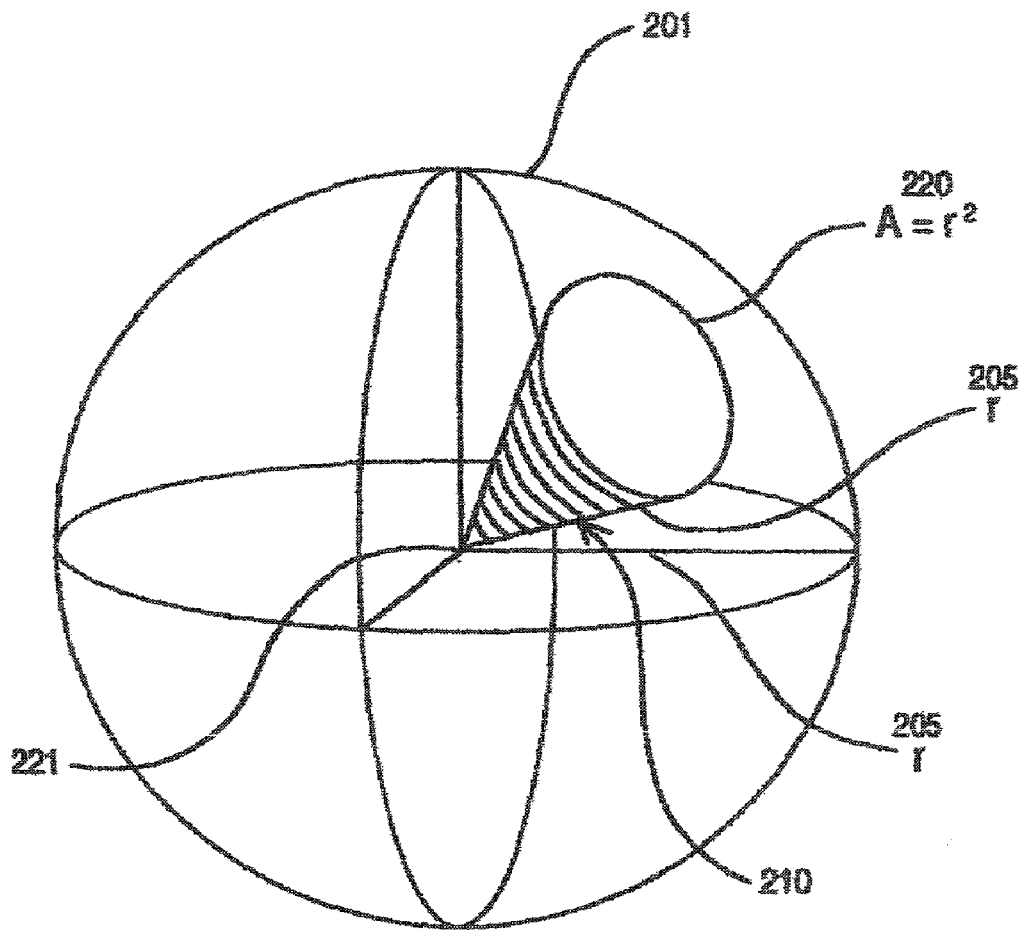
FIG. 2 illustrates a steradian.
Figure 3:
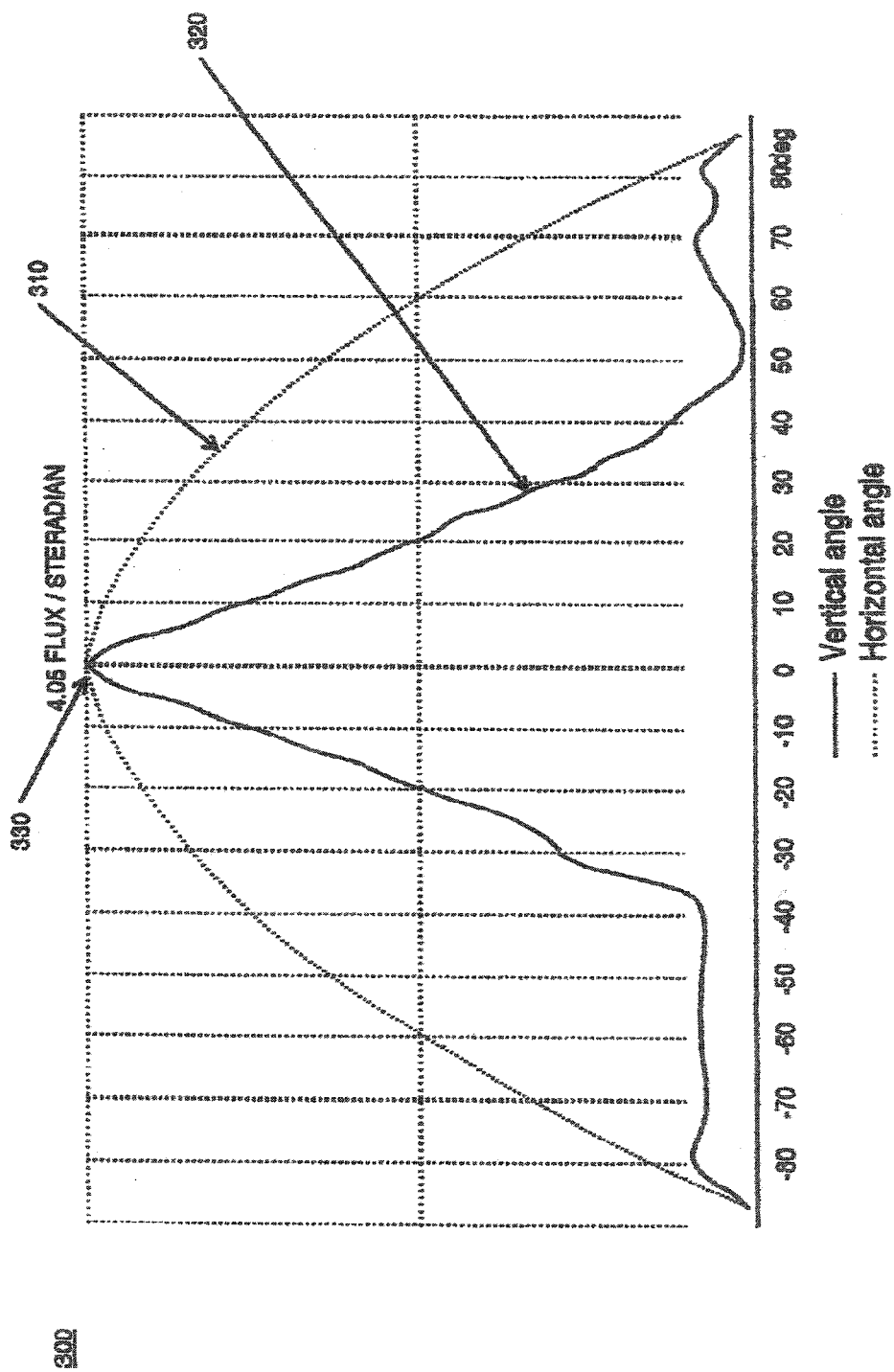
FIG. 3 is a radiant intensity profile of a conventional spherical dome lens with an LED chip/die.
Figure 4:
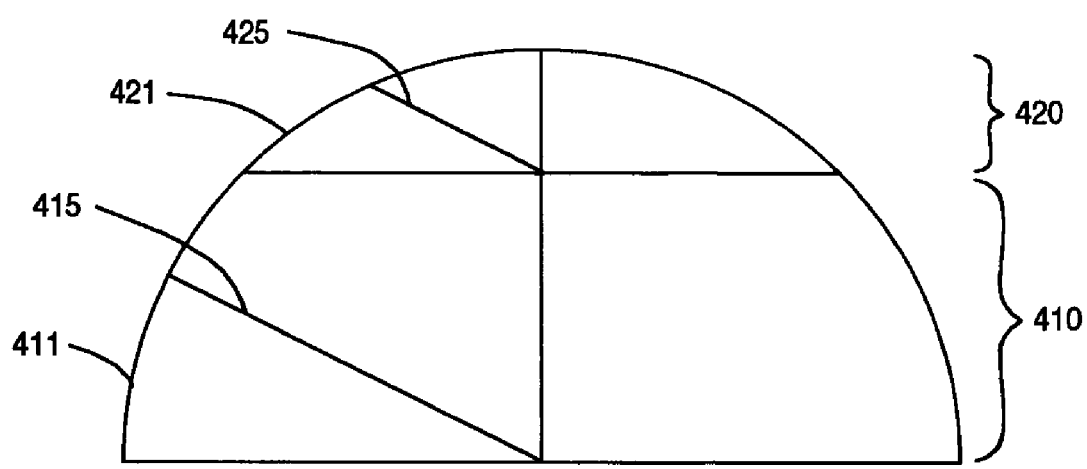
FIG. 4 depicts a bi-curvature dome lens in accordance with embodiments of the present invention.

One embodiment of the present invention is a bi-curvature dome shaped lens 400, depicted in FIG. 4. The profile of a bi-curvature lens is defined by two curvatures, hence the term "bi-curvature." As illustrated in FIG. 4, the bottom portion 410 of the dome 400 has a hemispherical contour 411, and radius r1 (415). The top portion 420 has an aspheric contour 421, a radius of curvature r2 (425) and a conic constant k. The conic constant k is a function of the eccentricity of the aspheric contour, where the eccentricity defines the deviation from spherical of the aspherical contour. For a sphere, the conic constant is zero. The term aspherical, in this context, refers to a surface or contour that is not spherical, e.g. the conic constant is not equal to zero. In one embodiment, the aspherical contour 421 is an elliptical contour.

Figure 5:
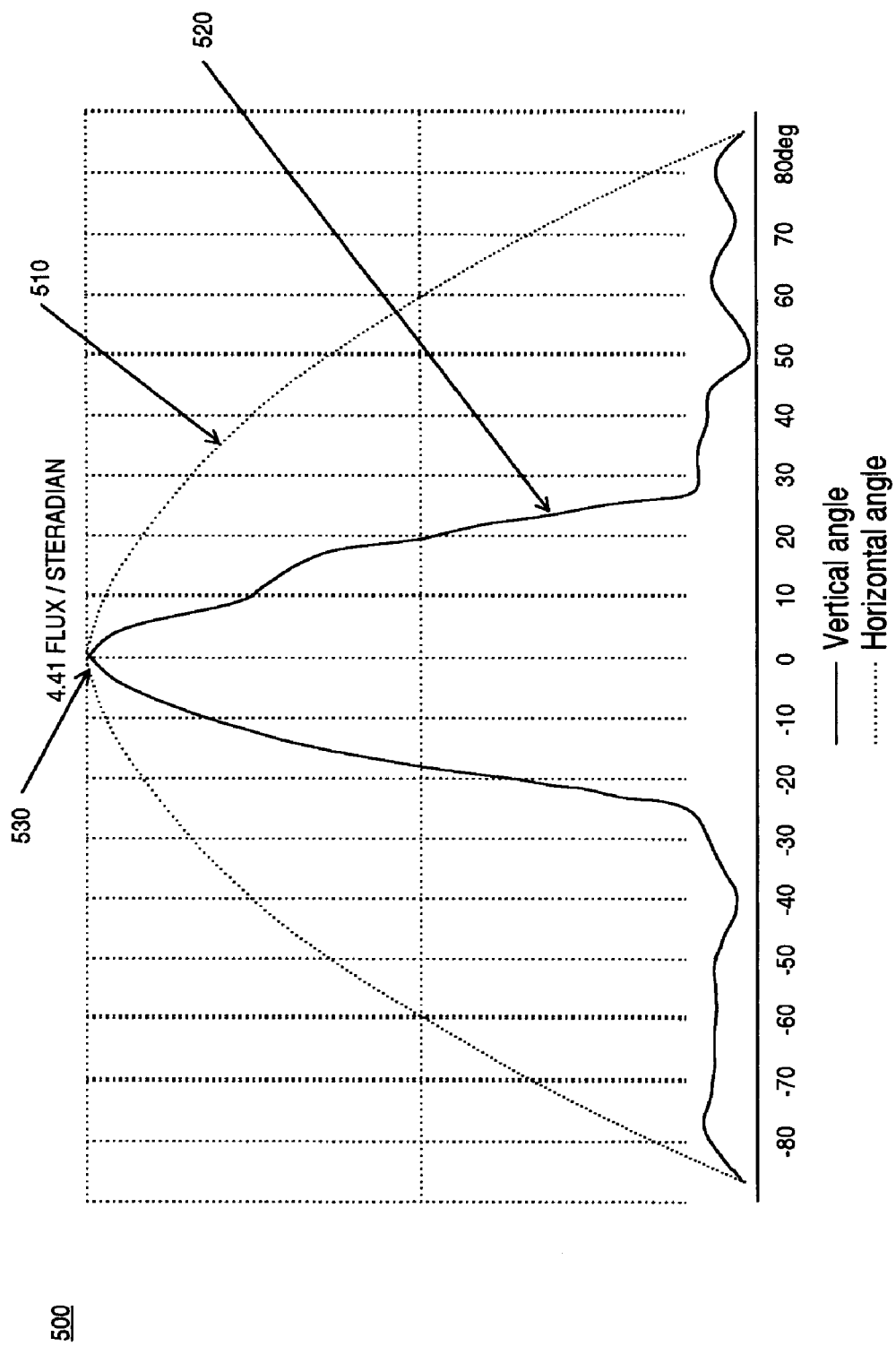
FIG. 5 is a radiant intensity profile of a bi-curvature dome lens in accordance with embodiments of the present invention.

FIG. 5 illustrates a radiant intensity profile 500 of the light distribution of an LED having a bi-curvature lens (as in FIG. 4) according to embodiments of the present invention. The flux per sterad ian in the horizontal direction (510) is symmetrical about the maximum 530. The flux per sterad ian in the vertical direction (520) is also symmetrical about he maximum 530. Symmetry about the maximum in both the horizontal and vertical directions of radiant intensity is required to satisfy Infrared Data Association (IrDA) standards and protocol.

Figure 6:
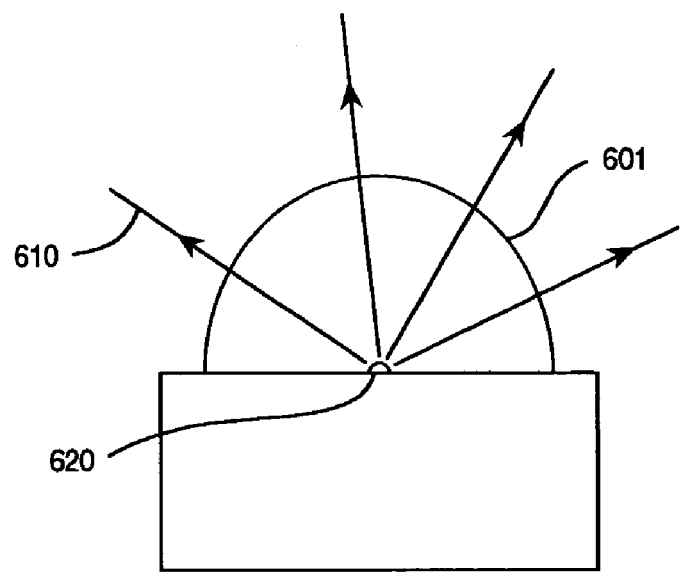
FIG. 6 depicts a light emitting device with a bi-curvature dome lens in accordance with embodiments of the present invention.
Figure 7:
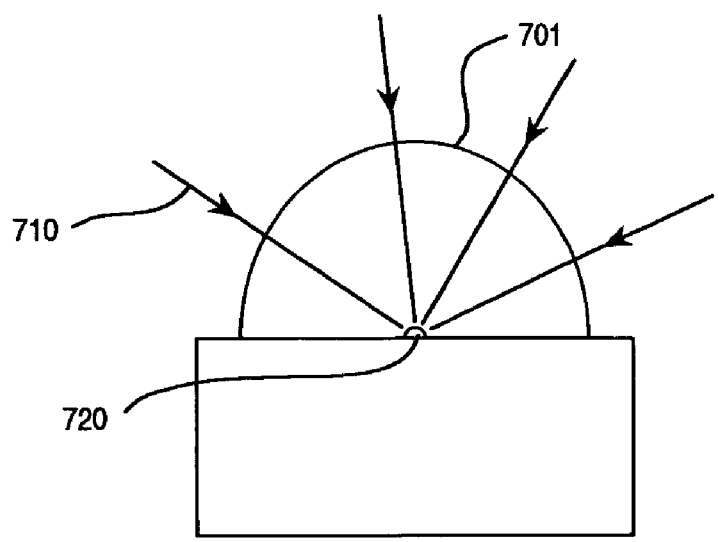
FIG. 7 depicts a light receiving device with a bi-curvature dome lens in accordance with embodiments of the present invention.

Referring now to FIG. 6, a bi-curvature lens 601 can be used to direct light 610 emitted from a light emitting diode chip/die 620, e.g. an infrared emitting device, according to one embodiment of the present invention. A bi-curvature lens 701 according to embodiments of the present invention can also be used to direct light 710 for detection at a photo detector 720, as illustrated in FIG. 7. In one embodiment, the photo detector 720 depicted in FIG. 7 is a photo detector chip, and in another embodiment, the photo detector 720 depicted in FIG. 7 is a photo detector die. A bi-curvature dome lens in accordance with embodiments of the present invention could be employed to guide any wavelength of visible light, infrared light, ultraviolet, or other light. Light transmitted through a bi-curvature dome lens in accordance with embodiments of the present invention will display symmetry of radiant intensity along the horizontal and the vertical directions, as required by the IrDA.

The diameter of a lens in accordance with the present invention can be smaller than the diameter of a conventional spherical lens. Thus, a transceiver having bi-curvature lenses can be smaller and more compact than a transceiver having spherical lenses. A wireless communication device having transceivers with bi-curvature lenses can be smaller and more compact than a wireless communication device having transceivers with conventional spherical lenses.

Figure 8:
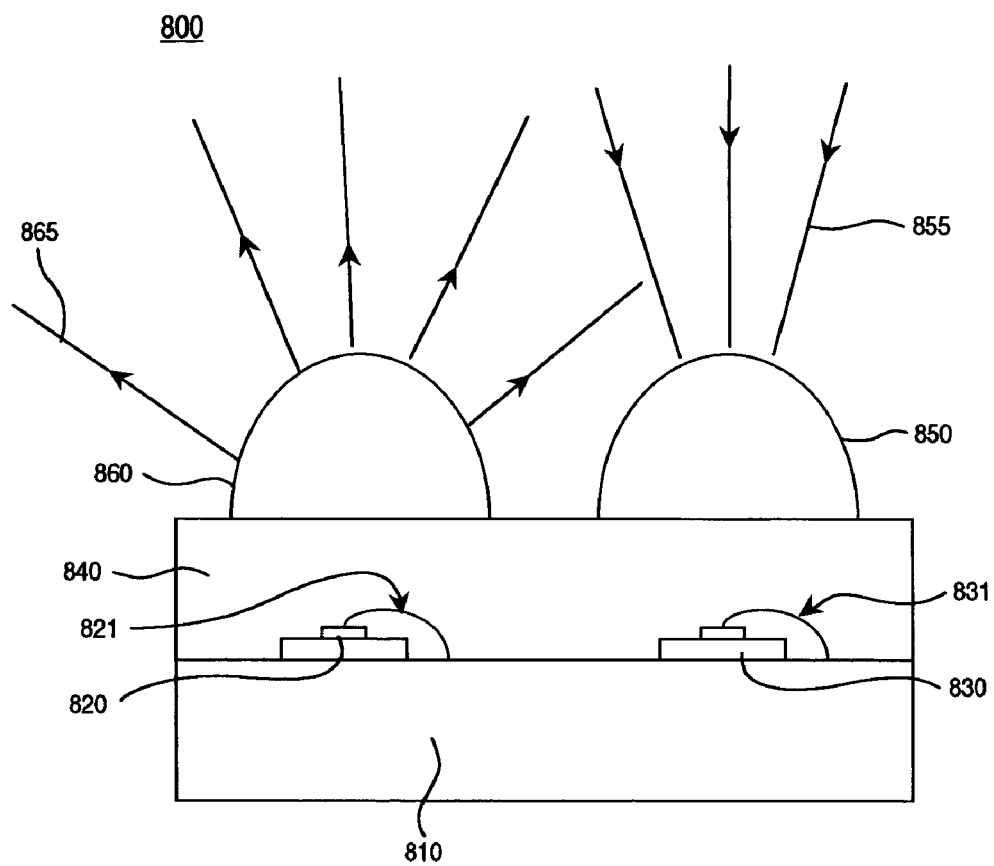
FIG. 8 illustrates a transceiver having bi-curvature dome lenses in accordance with embodiments of the present invention.

FIG. 8 illustrates a wireless communication transceiver 800, in one embodiment an infrared wireless communication transceiver. An LED chip 820 is attached with a PCB substrate 810 by a bondable wire 821. A photo detector chip 830 is attached with PCB substrate 810 by a bondable wire 831. A layer of epoxy 840 covers the LED chip 820 and the photo detector chip 830. Light 865 emitted by the LED chip 820 is transmitted through a bi-curvature lens 860 to produce symmetrical radiant intensity in both the horizontal and vertical directions, as illustrated by the radiant intensity profile of FIG. 5. Light 855 transmitted through a bi-curvature lens 850 in accordance with the present invention is received at the photo detector chip 830.

Figure 9:
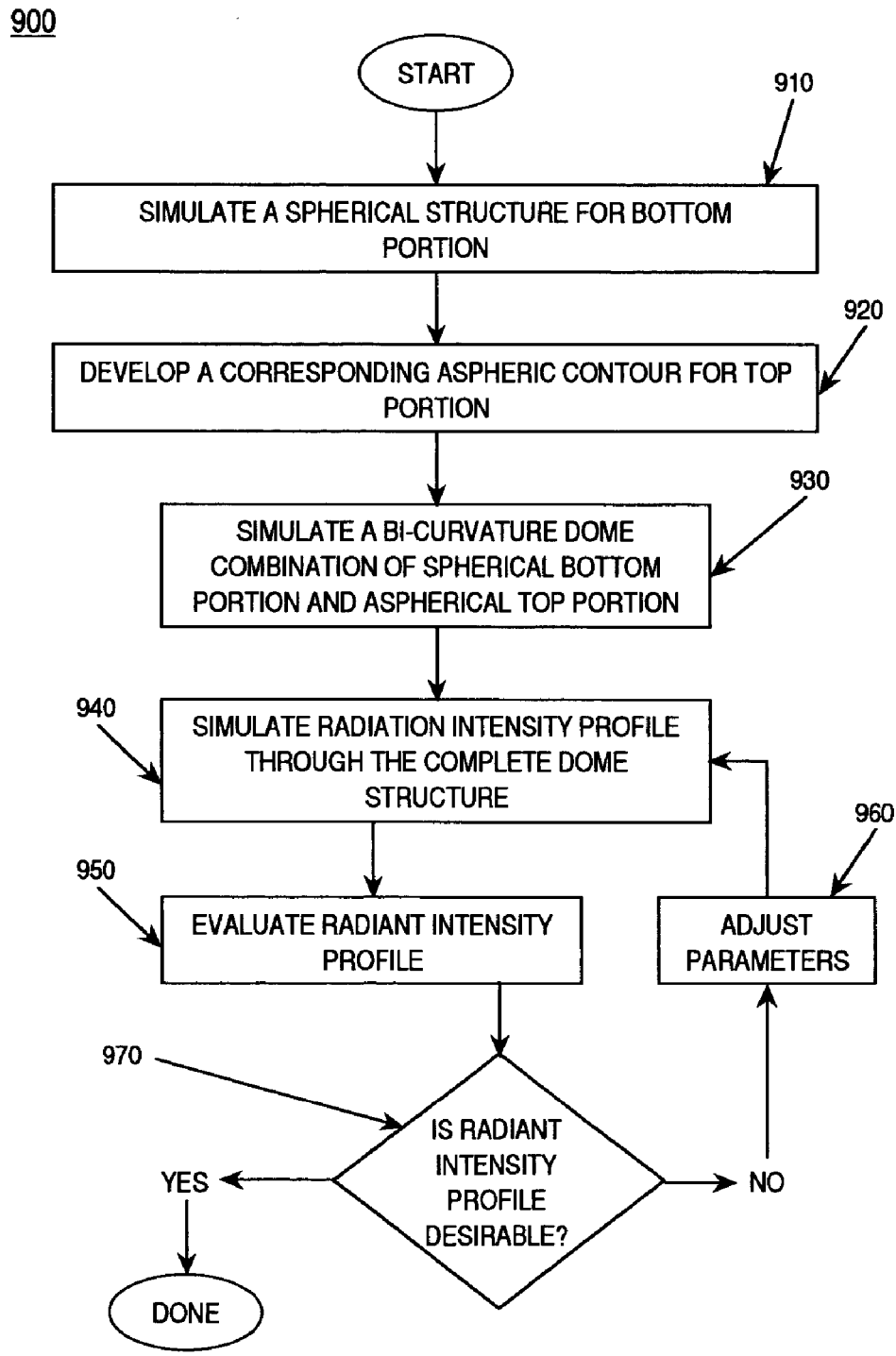
FIG. 9 is a flowchart reciting steps in a method of designing a bicurvature dome lens.

One embodiment of the present invention is the design method employed to obtain a bi-curvature dome capable of emitting light of symmetrical radiant intensity, in both the horizontal and the vertical directions. One design method is recited in flowchart 900 of FIG. 9. Initially, a spherical structure, e.g. a hemispherical structure, is simulated for the bottom portion (410 in FIG. 4) of the bi-curvature lens (400 in FIG. 4), as in step 910. A sequential ray trace program can then be employed to develop an aspheric contour (421 in FIG. 4) for the top portion (420 in FIG. 4) of the dome (400 in FIG. 4), as described in step 920 of flowchart 900. A subsequent step 930 is the simulation of a bi-curvature dome (400 in FIG. 4) that combines the spherical bottom portion (410 in FIG. 4) simulated at step 910 and the aspherical top portion (420 in FIG. 4) simulated at step 920. Once the combination bi-curvature dome structure has been developed at step 930, a radiation intensity profile (e.g. FIG. 5) is simulated through the entire dome structure (400 in FIG. 4), as indicated by step 940 in flowchart 900. The radiation intensity profile simulated at step 940 is evaluated at step 950. At step 970, it is determined whether or not the radiation intensity profile simulated at step 940 is desirable. The radiation intensity profile simulated at step 940 is desirable if it is symmetric about a maximum in both the horizontal and the vertical directions, as in FIG. 5. If the radiation intensity profile is satisfactory, the design process is done. If the radiation intensity profile is not satisfactory, e.g. not substantially symmetric about a maximum in both the horizontal and the vertical directions, certain parameters of the design can be altered, as in step 960 in flowchart 900. For example, referring to FIG. 4, the contour 421 of the aspheric portion 420 of the lens 400 could be modified by increasing or decreasing the radius of curvature r2 425 or the conic constant k. Another example of a parameter that can be altered is the proportion of the bottom spherical portion 410 and the top aspherical portion 420 with respect to the height of the dome 400. According to an embodiment of the present invention, various iterations are carried out until a desired radiant intensity distribution is obtained. Referring to flowchart 900, steps 940-970 are repeated until substantially symmetry is achieved in the radiant intensity profile simulated at step 940.

Figure 10:
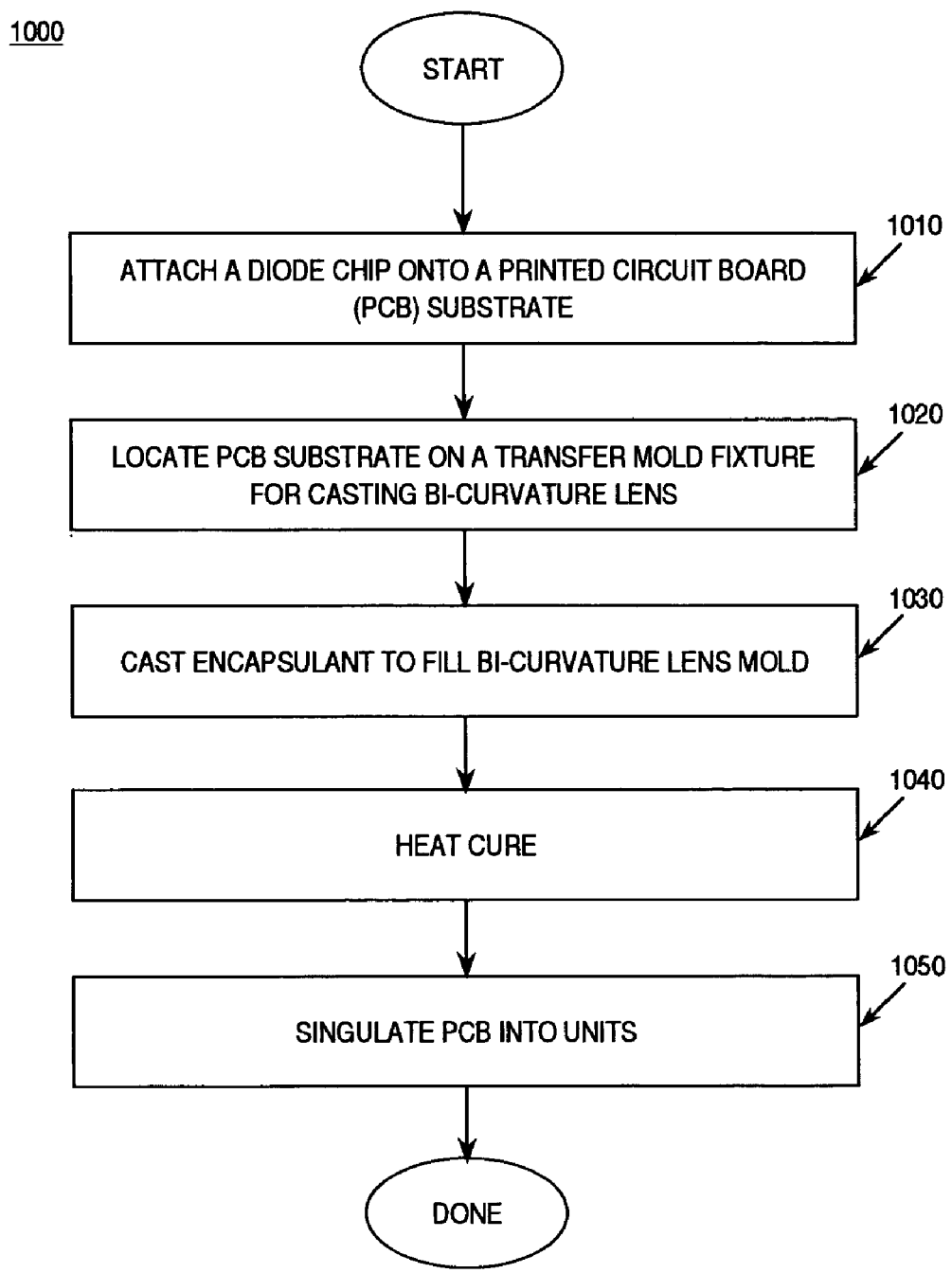
FIG. 10 is a flowchart illustrating steps in a method of fabricating an emitter and/or receiver LED and/or photo detector device disclosed in the present invention.

In one embodiment, a wireless communication transceiver is fabricated by a transfer mold method as recited in flowchart 1000 of FIG. 10. Initially, at least one diode chip, such as an LED chip (e.g. an IRED chip) or an infrared photo detector chip is attached to a printed circuit board (PCB) substrate, as recited in step 1010. For a transceiver, an LED chip and a photo detector chip are attached to the printed circuit board, adjacent to each other, as depicted in FIG. 8. Each chip is wire bonded to an electrical terminal of the PCB substrate. A layer of epoxy may be formed on the surface of the printed circuit board substrate, covering the diode(s). Subsequently, as recited in step 1020, the PCB substrate is located on a transfer mold fixture that has molds for bi-curvature lenses in accordance with embodiments of the bi-curvature dome lens of the present invention. Proceeding to step 1030, an encapsulant is then cast to fill the bi-curvature lens mold, followed by a heat cure in step 1040 to ensure that the bi-curvature dome lenses have the desired properties for light emission and/or reception. After a heat cure, the printed circuit board is ready to be singulated into individual light emitting units, photo detector units, or transceiver units, as recited in step 1050. Singulation of the PCB may be accomplished by proper sawing.

It can be appreciated that the bi-curvature dome lens of the present invention can be formed from any material rendering efficient light transmission. A bi-curvature dome lens in accordance with embodiments of the present invention is not limited to infrared wireless communication applications. Embodiments of the present invention permit optics designers to achieve desired radiant intensity profiles using very small lenses, e.g. lenses having very small diameters. The cost of fabrication of bi-curvature lenses is comparable to the cost of fabrication of conventional spherical lenses.

The foregoing description of specific embodiments of the present invention has been presented for purposes of illustration and description. They are not intended to be exhaustive or to limit the invention to the precise forms disclosed, and many modifications and variations are possible in light of the above teaching. The embodiments of were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A light emitting device comprising:
   a light emitting diode; and
   a bi-curvature dome lens, said lens comprising:
   a hemispherical portion comprising a first radius; and
   an aspherical portion comprising a second radius and a conic constant not equal to zero; and
   wherein light emitted from said light emitting diode and transmitted through said bi-curvature lens comprises a radiant intensity distribution, wherein said radiant intensity distribution is symmetrical about a maximum in a horizontal angular direction and symmetrical about the maximum in a vertical angular direction.

2. The light emitting device of claim 1 wherein said hemispherical portion is a bottom portion of said dome and said aspherical portion is a top portion of said dome.

3. The light emitting device of claim 1 wherein said light emitting diode is a light emitting chip, wherein said light emitting chip is embedded in said bi-curvature dome lens.

4. The light emitting device of claim 1 wherein said light emitting diode is a light emitting die, wherein said light emitting die is embedded in said bi-curvature dome lens.

* * * * *